US010575441B2

(12) United States Patent
Hsu

(10) Patent No.: US 10,575,441 B2
(45) Date of Patent: Feb. 25, 2020

(54) ELECTRICAL CONNECTOR ASSEMBLY

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventor: Chun-Hsiung Hsu, New Taipei (TW)

(73) Assignees: FOXCONN (KUNSHAN) COMPUTER CONNECTOR CO., LTD, Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/382,225

(22) Filed: Apr. 12, 2019

(65) Prior Publication Data

US 2019/0320552 A1 Oct. 17, 2019

(30) Foreign Application Priority Data

Apr. 13, 2018 (CN) ..................... 2018 2 0530198 U

(51) Int. Cl.
*H01R 9/26* (2006.01)
*H05K 7/20* (2006.01)
*H01R 13/6594* (2011.01)
*H01R 12/72* (2011.01)

(52) U.S. Cl.
CPC ......... *H05K 7/2039* (2013.01); *H01R 12/721* (2013.01); *H01R 13/6594* (2013.01)

(58) Field of Classification Search
CPC ...... H01R 9/26; H01R 9/2675; H01R 9/2408; H01R 27/00; H01R 103/00
USPC ..... 439/716, 218, 715, 717, 222; 307/43, 32
See application file for complete search history.

(56) References Cited

U.S. PATENT DOCUMENTS

| 9,188,752 | B2 * | 11/2015 | Nong Chou | ......... G02B 6/4266 |
|---|---|---|---|---|
| 9,354,404 | B2 * | 5/2016 | Ql | ......................... G02B 6/428 |
| 9,761,974 | B2 | 9/2017 | L'Esperance | |
| 2001/0049214 | A1 * | 12/2001 | Billman | ............. H01R 13/6485 439/138 |
| 2015/0132990 | A1 * | 5/2015 | Nong Chou | ......... G02B 6/4266 439/487 |
| 2015/0249308 | A1 * | 9/2015 | Recce | .................. H01R 13/641 439/490 |
| 2016/0218455 | A1 * | 7/2016 | Sayre | ................. H01R 13/6594 |
| 2018/0337476 | A1 | 11/2018 | Guy Ritter et al. | |
| 2018/0368283 | A1 | 12/2018 | Little | |

* cited by examiner

*Primary Examiner* — Phuong Chi Thi Nguyen
(74) *Attorney, Agent, or Firm* — Wei Te Chung; Ming Chieh Chang

(57) ABSTRACT

An electrical connector assembly includes: a metal shell including a top wall, a bottom wall, a pair of parallel spaced side walls connecting the top and bottom walls, a receiving space, and a front opening communicating with the receiving space; a connector received in the receiving space of the metal shell; and a heat sink disposed in the rear side of the metal shell, wherein the metal shell includes a rear opening communicating with the receiving space, and the heat sink covers the rear opening.

11 Claims, 13 Drawing Sheets

US 10,575,441 B2

1

ELECTRICAL CONNECTOR ASSEMBLY

BACKGROUND OF THE INVENTION

1. Field of the Invention

The present invention relates generally to an electrical connector assembly, and more particularly to an electrical connector assembly with a metal shell structure.

2. Description of Related Arts

U.S. Pat. No. 9,761,974, issued on Sep. 12, 2017, discloses an electrical connector assembly which includes a metal shell, a connector received in the metal shell, a heat dissipation block mounted in the rear side of the metal shell, and a heat pipe with heat conduction from heat sink and extending into the metal shell. The metal shell includes an intermediate member dividing the metal shell into two receiving spaces spaced apart in the up and down direction. The intermediate member includes a heat sink is thermally conductive with the lower receiving space, the heat conduction between the heat pipe and the heat sink. The metal shell includes a rear wall disposed between the connector and the heat dissipation block, a rear wall disposed between the connector and the heat dissipation block. The metal shell includes a rear wall disposed between the connector and the heat dissipation block. The function of the rear wall is to electromagnetically shield the connector at a later time, and the heat dissipation block is generally also made of a metal material and also has a shielding effect. Therefore, the back wall has an increased material and manufacturing cost.

An improved electrical connector assembly is desired.

SUMMARY OF THE INVENTION

An object of the present invention is to provide an electrical connector assembly with a good shielding effect and lower cost.

To achieve the above-mentioned object, an electrical connector assembly comprises: a metal shell including a top wall, a bottom wall, a pair of parallel spaced side walls connecting the top and bottom walls, a receiving space, and a front opening communicating with the receiving space; a connector received in the receiving space of the metal shell; and a heat sink disposed in the rear side of the metal shell, wherein the metal shell includes a rear opening communicating with the receiving space, and the heat sink covers the rear opening.

Compared to the prior art, the heat sink of the electrical connector assembly of the present invention covers the rear opening so that the connector can be shielded on the rear side for reducing the material amount and assembly process of the metal shell, thereby reducing the cost of the product.

2

Figure 1:
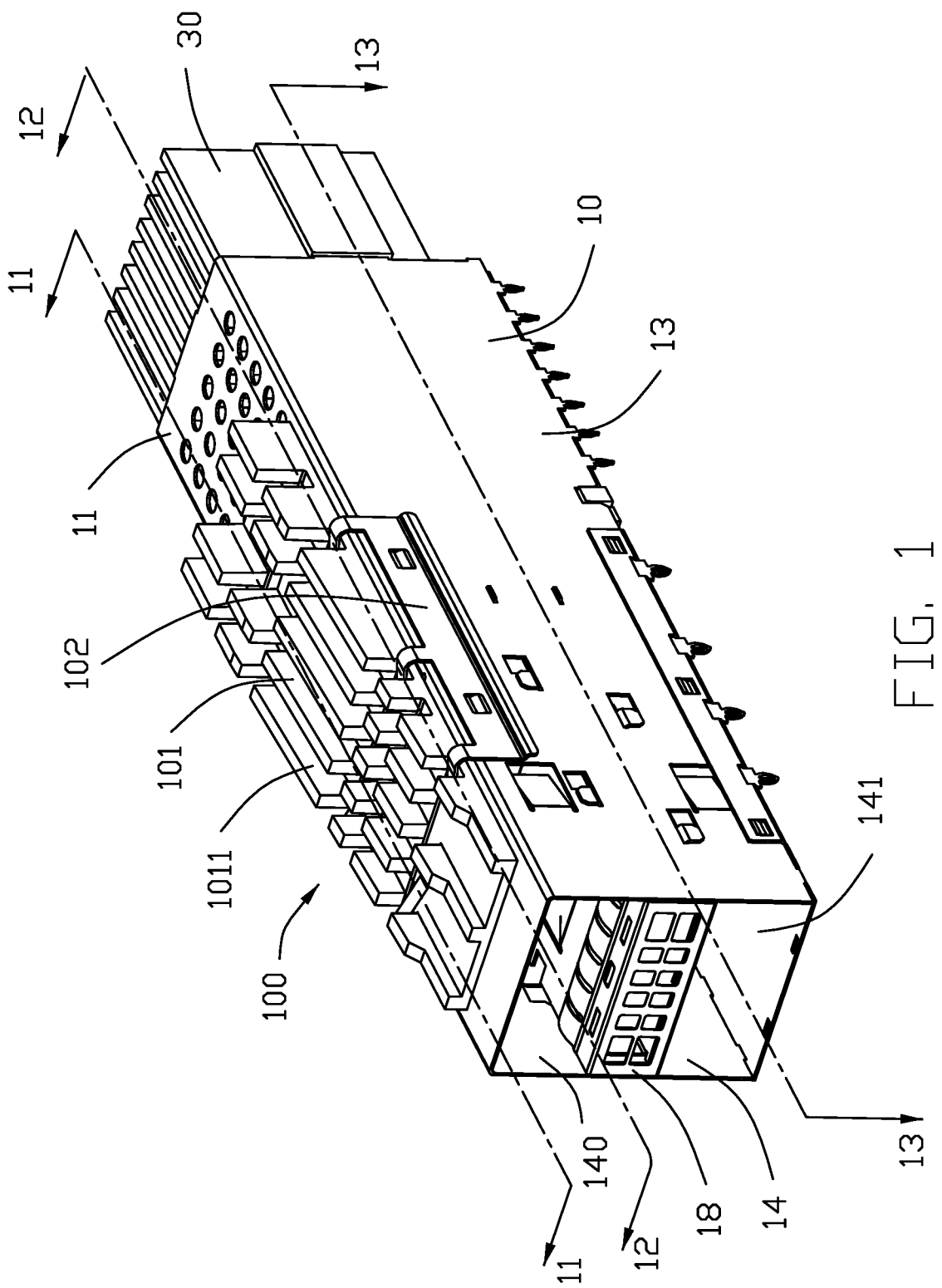
FIG. 1 is a perspective view of an electrical connector assembly in accordance with the present invention.
Figure 2:
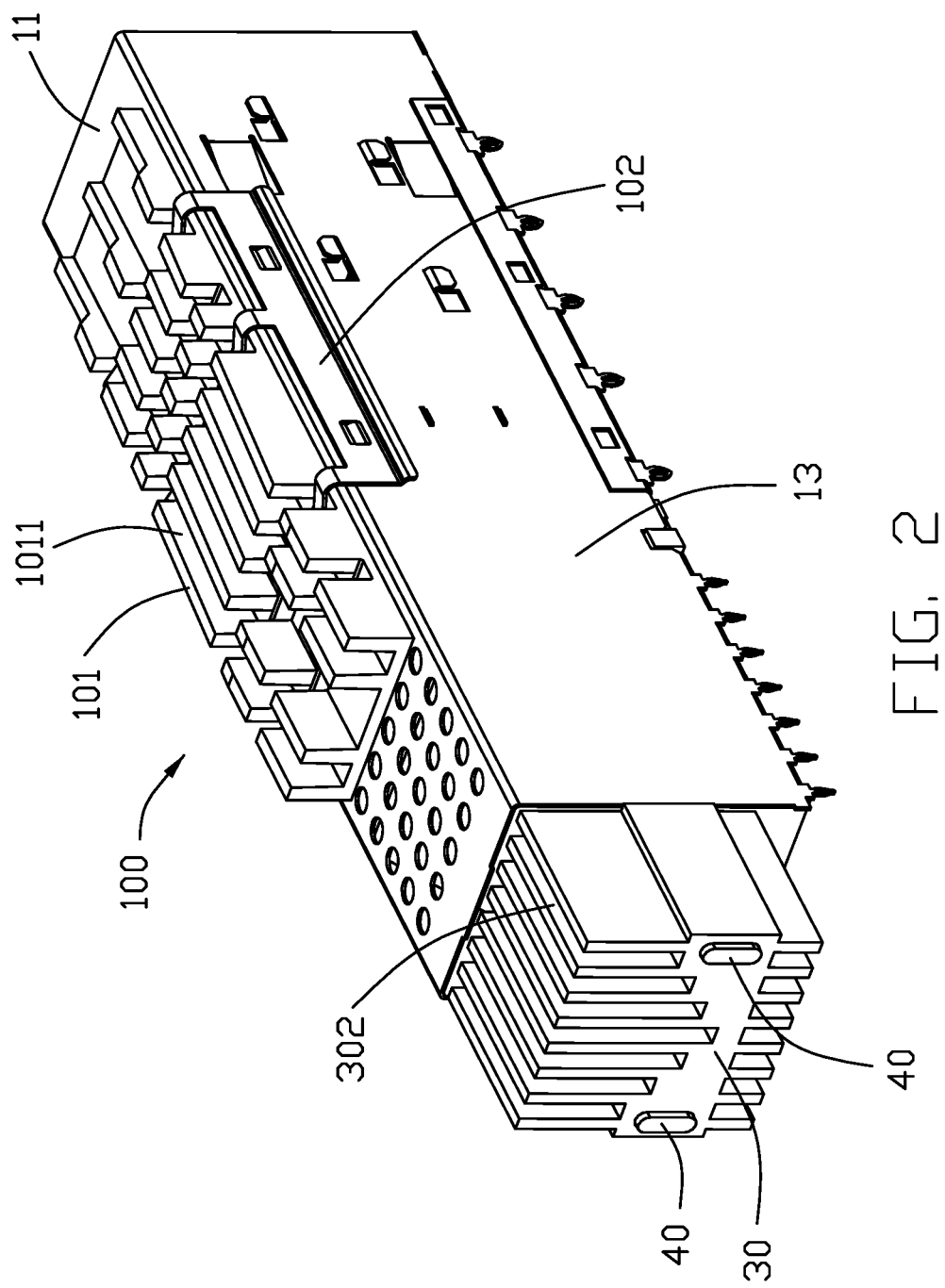
FIG. 2 is an another perspective view of the electrical connector assembly as shown in FIG. 1.
Figure 3:
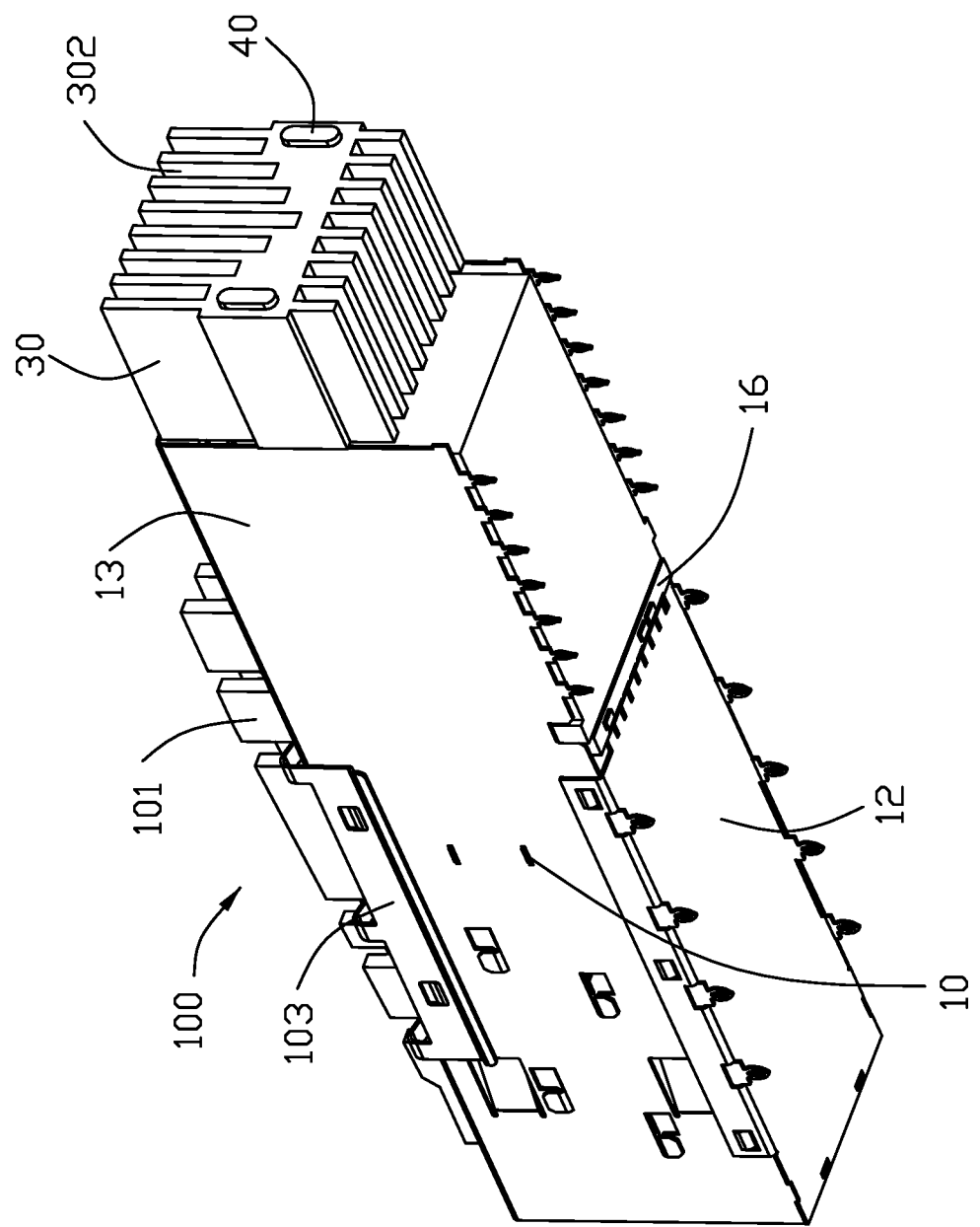
FIG. 3 is an another perspective view of the electrical connector assembly as shown in FIG. 2.
Figure 4:
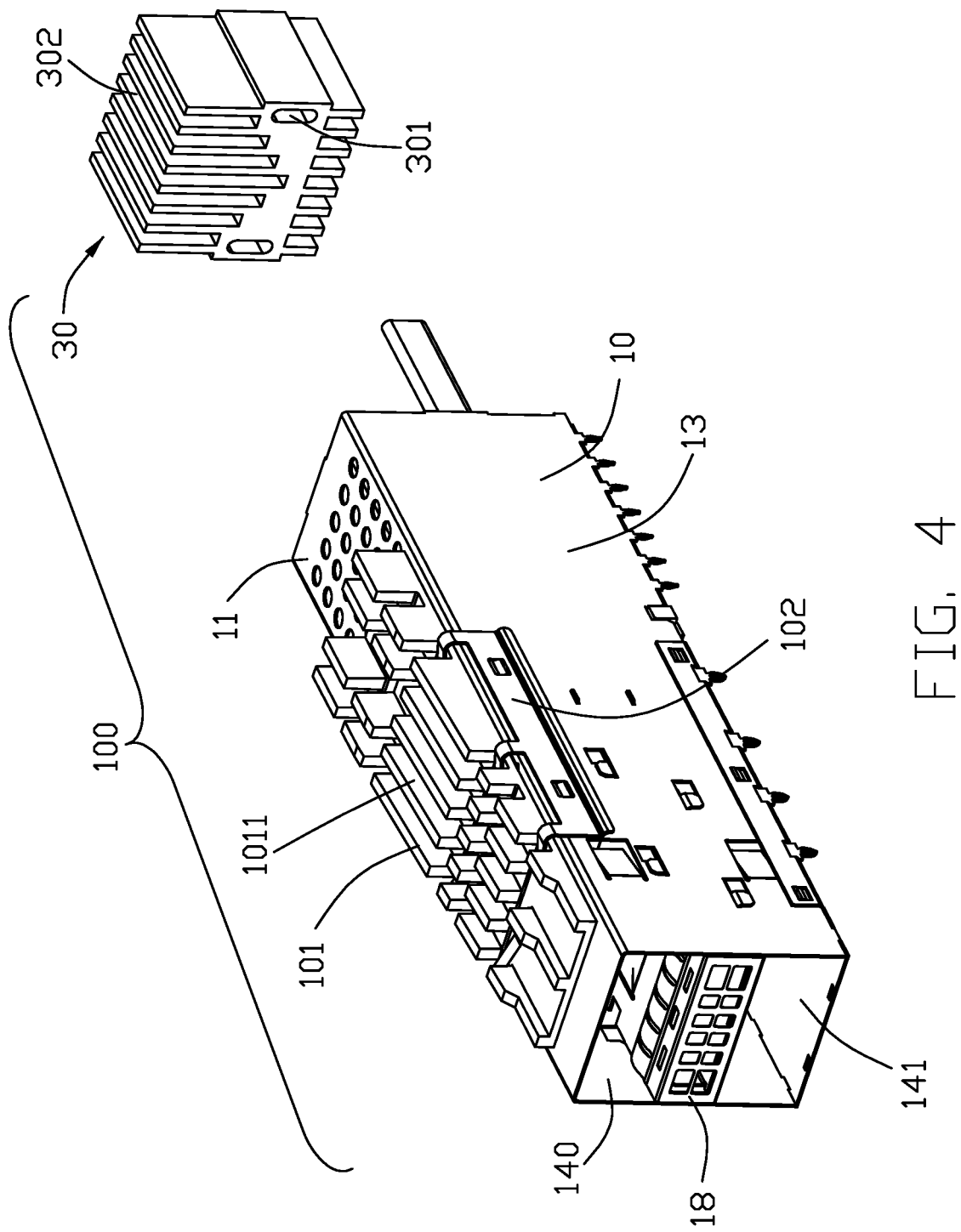
FIG. 4 is a partially exploded view of the electrical connector assembly as shown in FIG. 1.
Figure 5:
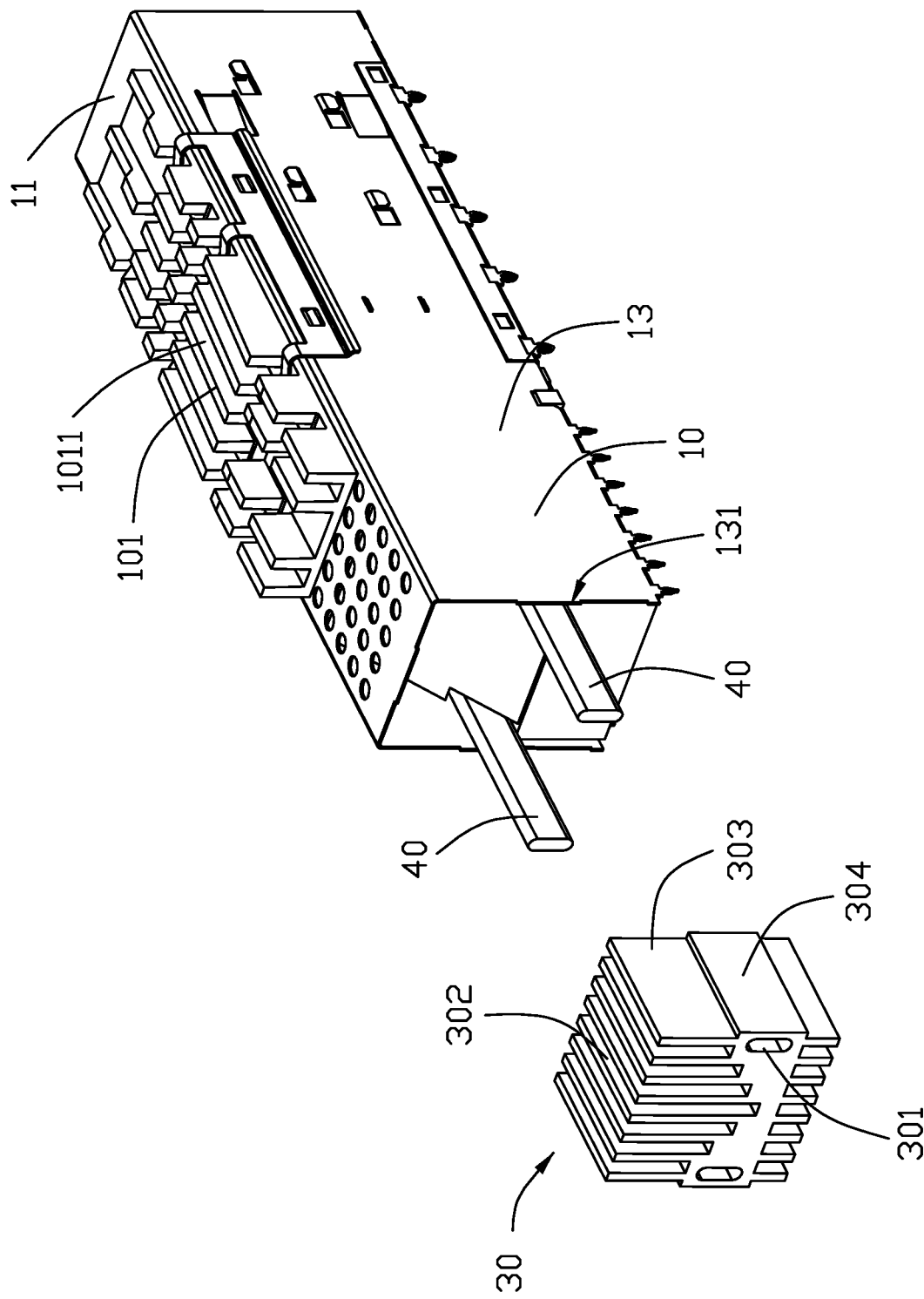
FIG. 5 is an another partially exploded view of the electrical connector assembly as shown in FIG. 4.
Figure 6:
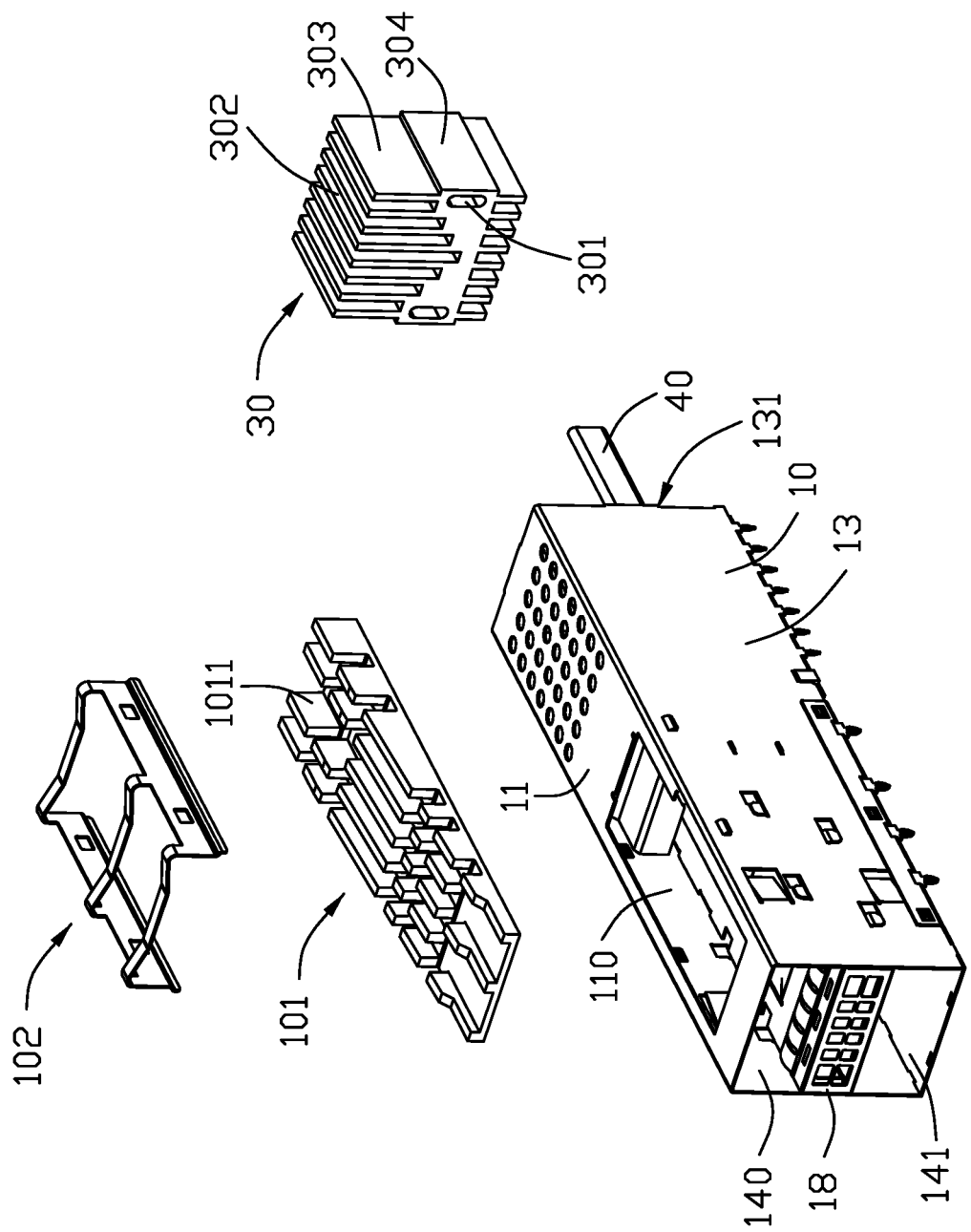
Figure 7:
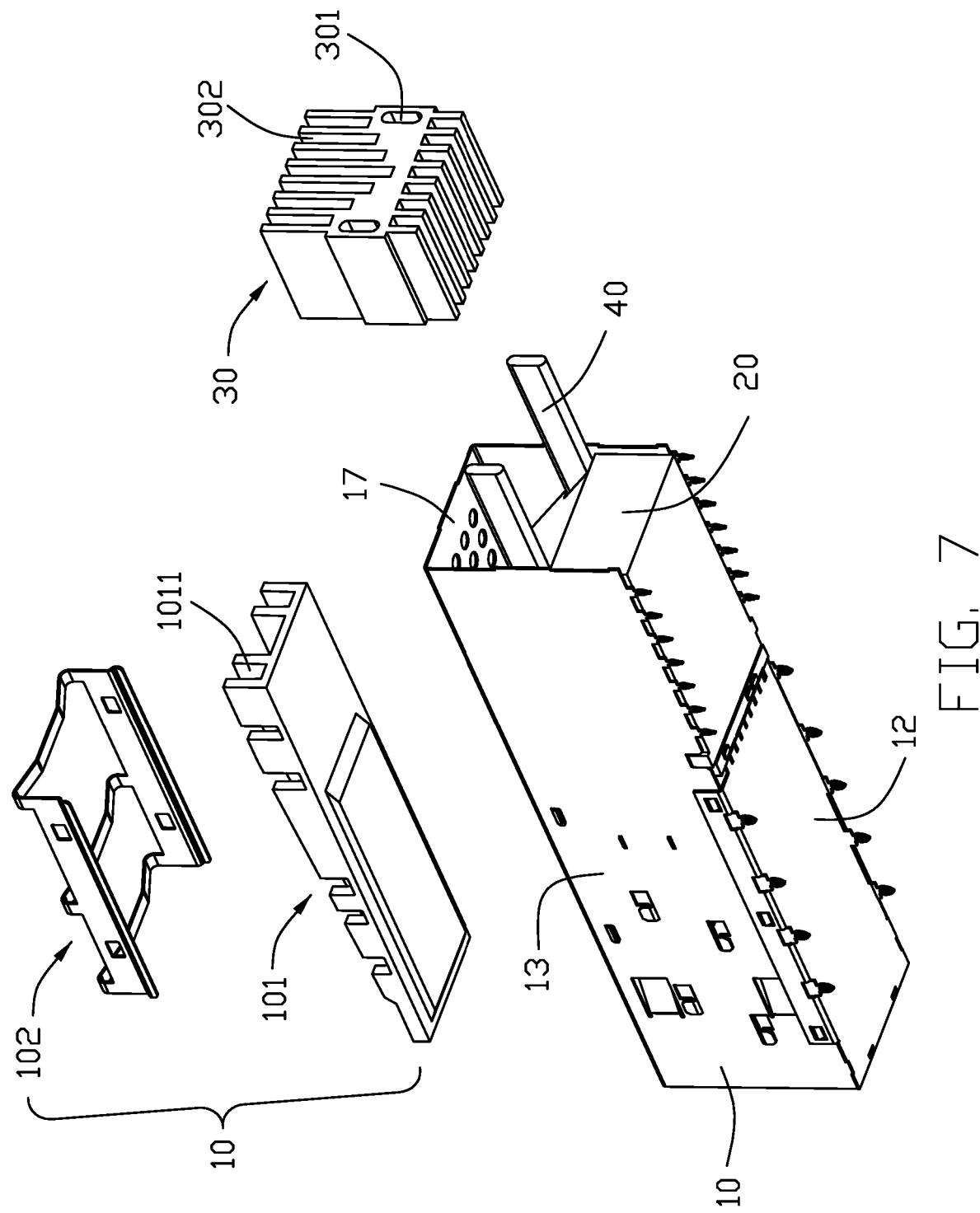
Figure 8:
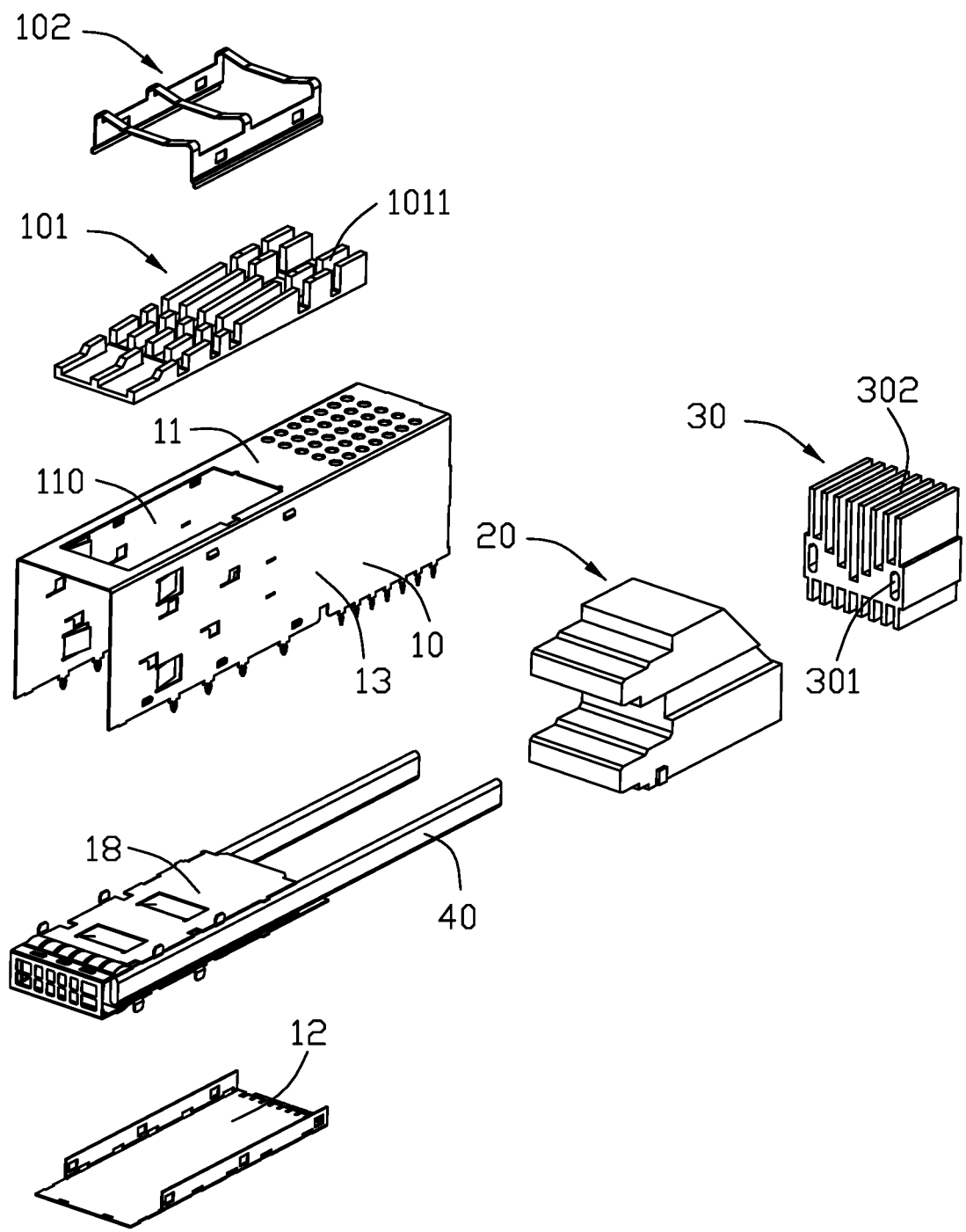
Figure 9:
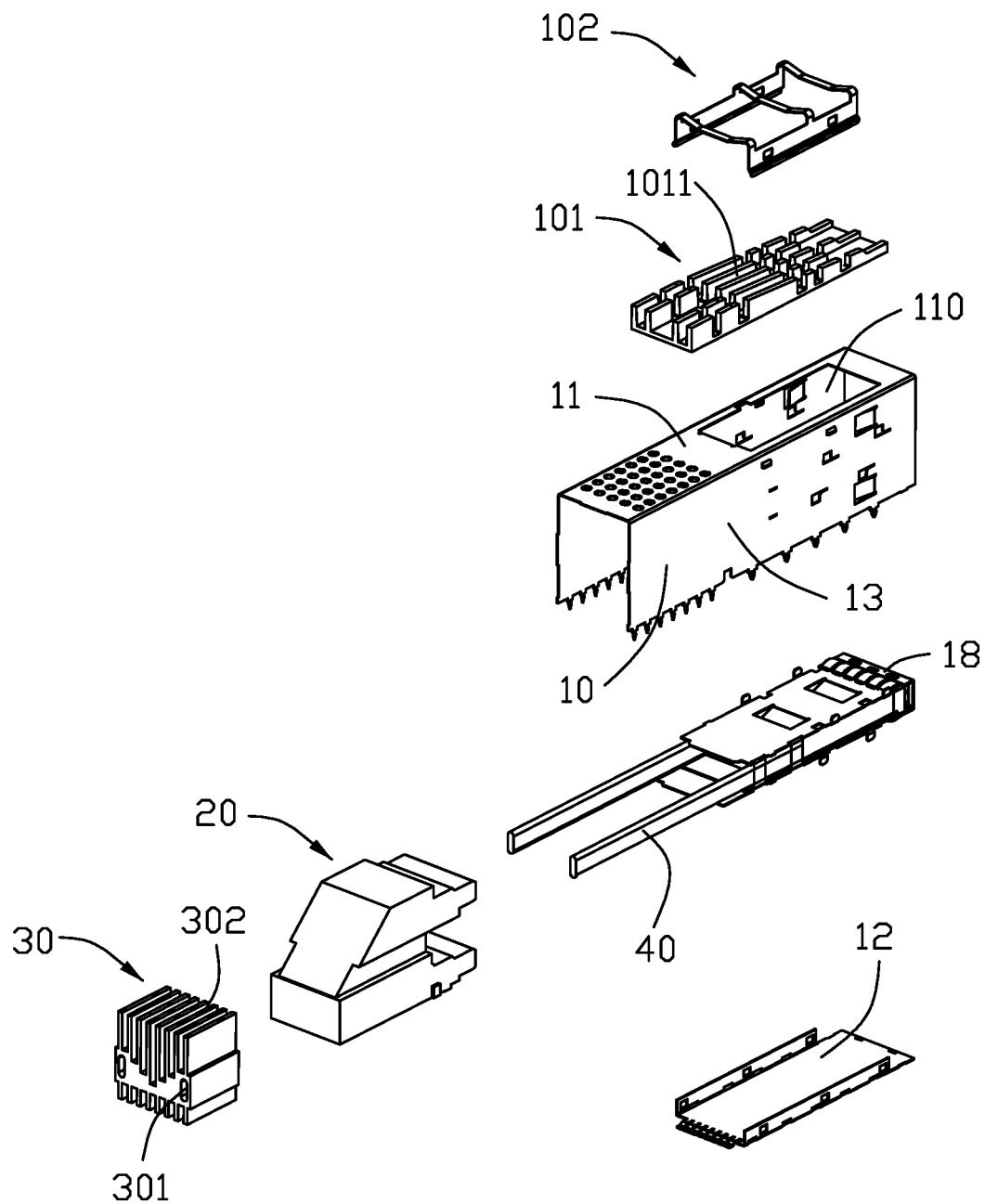
Figure 10:
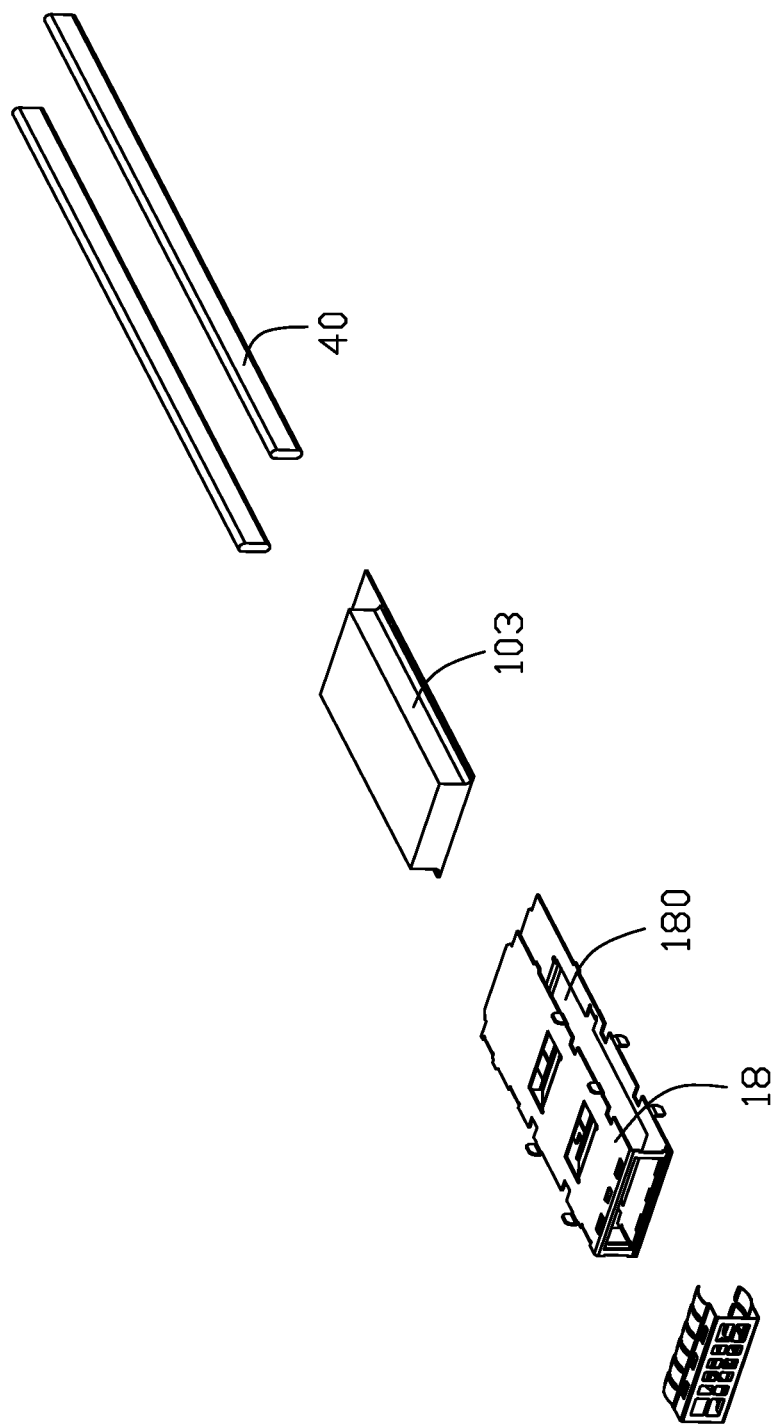
Figure 11:
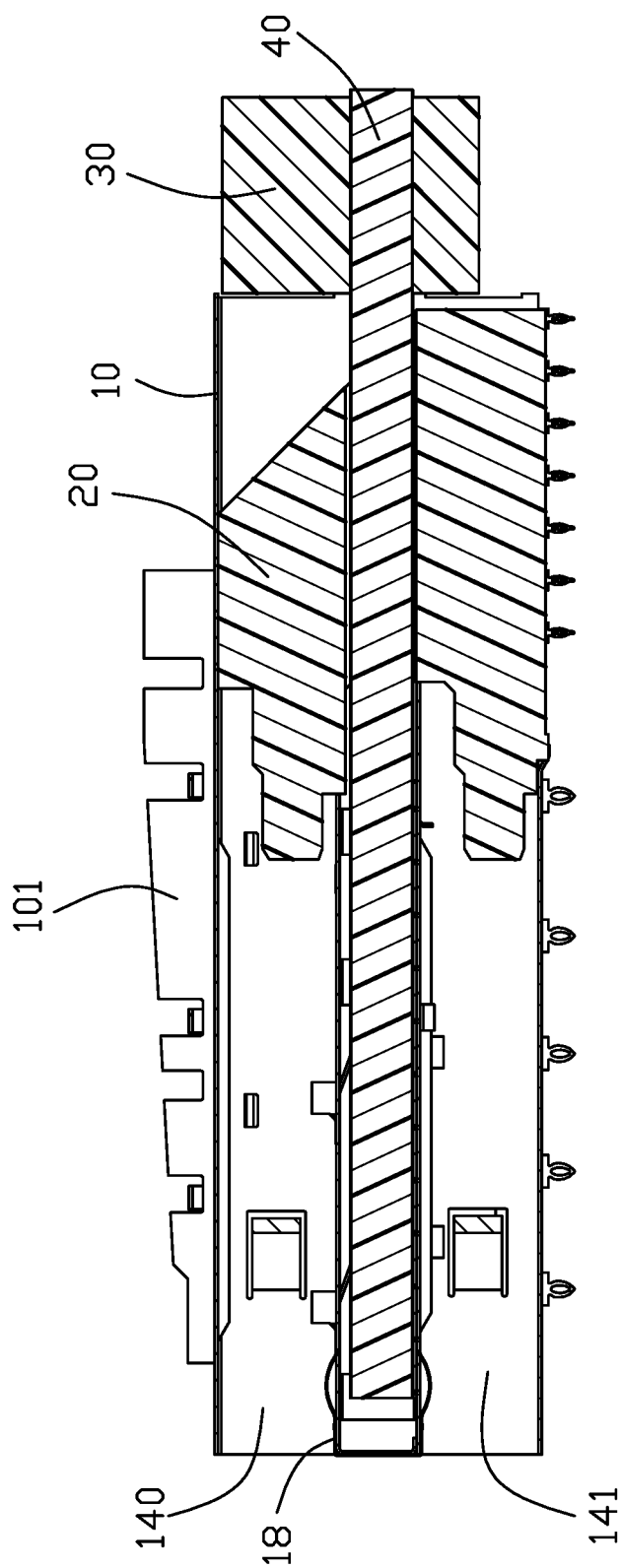
Figure 12:
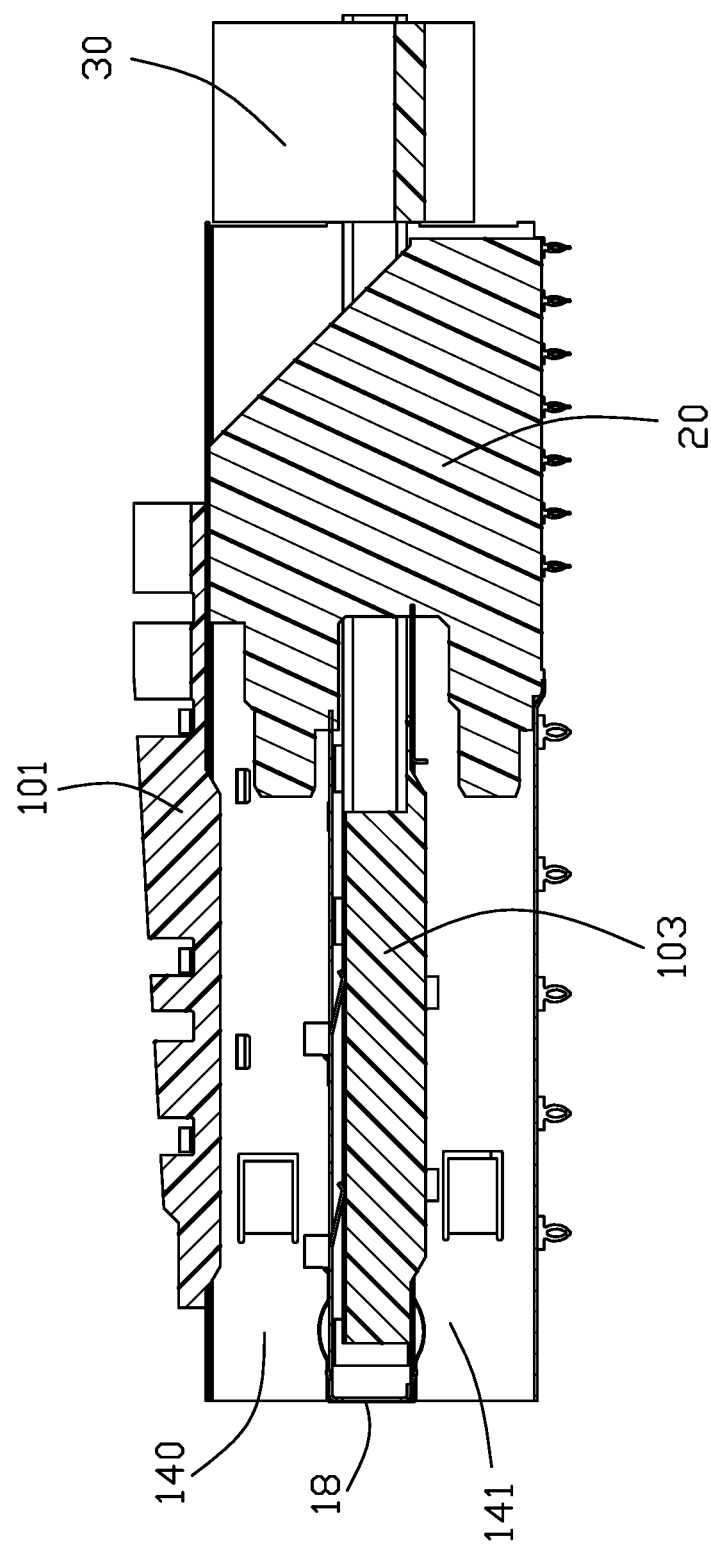
Figure 13:
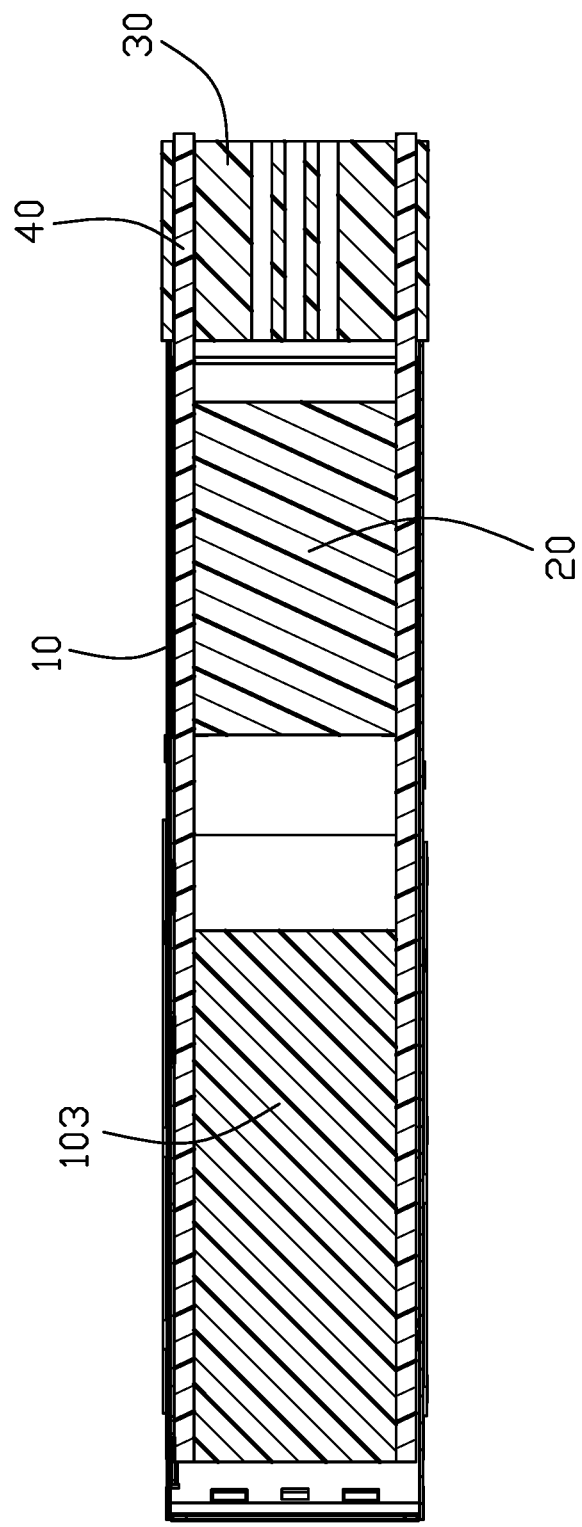

FIG. 6 is a further partially exploded view of the electrical connector assembly as shown in FIG. 4;

FIG. 7 is an another further partially exploded view of the electrical connector assembly as shown in FIG. 6;

FIG. 8 is a further partially exploded view of the electrical connector assembly as shown in FIG. 6;

FIG. 9 is an another further partially exploded view of the electrical connector assembly as shown in FIG. 8;

FIG. 10 is a partially perspective view of the electrical connector assembly as shown in FIG. 1;

FIG. 11 is a cross-sectional view taken along line 11-11 as shown in FIG. 1;

FIG. 12 is a cross-sectional view taken along line 12-12 as shown in FIG. 1; and FIG. 13 is a cross-sectional view taken along line 13-13 as shown in FIG. 1.

DETAILED DESCRIPTION OF THE PREFERRED EMBODIMENT

Referring to FIGS. 1-13, an electrical connector assembly 100 according to the present invention is to be mounted on an external printer circuit board and can be mated to a docking module (not shown). The electrical connector assembly 100 includes a metal shell 10, a connector 20 (without showing the contacts) received in the metal shell 10, a rear heat sink 30 disposed in the rear side of the metal shell 10, and a pair of heat conducting members 40 assembled with the heat sink 30.

The metal shell 10 includes a top wall 11, a bottom wall 12 disposed in parallel with the top wall 11, a pair of parallel spaced side walls 13 connecting the top wall 11 and the bottom wall 12, a receiving space 14, a front opening 15 communicating with the receiving space 14 for inserting and receiving the module (not shown) into the receiving space 14, a bottom opening 16 for the connector 20 to mate with an external printer circuit board, and a rear opening 17 communicating with the receiving space 14. The receiving space 14 is formed by the top wall 11, the bottom wall 12, and the pair of side walls 13. The connector 20 is received in the rear end of the receiving space 14. The heat conducting member 40 extends forward beyond the front end of the connector 20.

In this embodiment, the metal shell 10 further includes an intermediate member 18 dividing the receiving space 14 into an upper receiving space 140 and a lower receiving space 141 which is spaced apart from the upper receiving space 140 in the vertical direction. The upper receiving space 140 and the lower receiving space 141 can respectively receive the corresponding docking modules (not shown). The top wall 11 includes an upper through hole or top opening 110 connecting with the upper receiving space 140, the metal shell 10 includes an upper heat sink 101 disposed on the top wall 11, the upper heat sink 101 extends through the upper through hole 110 into the upper receiving space 140 and is thermally conducted by the plug module received in the upper receiving space 14. The metal shell 10 also includes a buckle member 102 transversely spanning the upper heat sink 101 and fitting with the side wall 13 to fix the upper heat sink 101 to the metal shell 10. The intermediate member 18 includes a lower through hole 180 communicating with the lower receiving space 141. The metal shell 10 includes a heat dissipation block 103 received in the intermediate member 18 extends through the lower through hole 180 into the lower receiving space 141 and the heat conduction of the plug module received in the lower receiving space 141, and the heat conducting member 40 is thermally conducted with the heat dissipation block 103. In this embodiment, the heat conducting member 40 includes a pair and received in the intermediate member 18. The pair of heat conducting members 40 are disposed on the both sides of the heat dissipation block 103 and directly connect with the heat dissipation block 103. Therefore, the heat generated by the plug module received in the lower receiving space 141 can be transmitted to the pair of heat conducting members 40 through the heat dissipation block 103, and then transmitted to the heat sink 30 to dissipate heat.

The heat sink 30 is disposed in the rear side of the metal shell 10 and covering the rear opening 17. The heat sink 30 is assembled and fixed with the heat conducting member 40. Specifically, in the embodiment, the heat sink 30 includes a mounting hole 301, and the heat conducting member 40 is mounted in the mounting hole 301. The heat sink 30 has a good heat conduction and electromagnetic shielding function, and covers the rear opening 17 to provide an electromagnetic shielding effect at the position of the rear opening 17, for reducing the material amount and assembly process of the metal shell 10, and reducing the cost of the product. In the embodiment, the heat sink 30 is made of a metal material. The heat sink 30 includes a plurality of heat dissipation channels 302 extending in the front-rear direction and formed by the corresponding fins 303 which are unified by the transverse bar 304 in which the mounting holes 301 extend along the front-to-rear direction. The upper heat sink 101 also includes a plurality of heat dissipation channels 1011 extending in the front-rear direction. Therefore, the extending direction of the heat dissipating channel 302 of the heat sink 30 is the same as the extending direction of the heat dissipating channel 1011 of the upper heat sink 101, which facilitates the penetration of the heat dissipating airflow and improves the heat dissipating effect.

The electrical connector assembly 100 of the present invention covers the rear opening 17 by the heat sink 30, so that the connector 20 can be shielded on the rear side for reducing the material amount and assembly process of the metal shell 10, and reducing the cost of the product. Generally speaking, in this embodiment the top wall 11 forms/leaves an opening 110 through which the upper heat sink 101 may contact the inserted plug module received within the upper space 140, and the bottom wall 12 forms/leaves another opening 16 through which the contact tails (not shown) of the electrical connector 20 extend for mounting to the printed circuit board (not shown) on which the whole electrical connector assembly 100 is seated, and a rear opening 17 without any rear wall so as to have the rear heat sink 30 completely directly communicate with the receiving space 14 along the front-to-back direction. Notably, a rear edge of each side wall 13 forms tiny protrusion 131 rearwardly abutting against the transverse bar 304 of the rear heat sink 30 for anti-vibration consideration of the rear heat sink 30. In this embodiment, the heat dissipation channels 302 are arranged with different depths wherein the center heat dissipation channel 304 are deepest for achieving the maximum heat dissipation effect, and the two side heat dissipation channels 304 are shallowest for complying with extension of the heat conductive members 40.

What is claimed is:

1. An electrical connector assembly comprising:
    a metal shell including a top wall, a bottom wall, a pair of parallel spaced side walls connecting the top and bottom walls, a receiving space, and a front opening communicating with the receiving space;
    a connector received in the receiving space of the metal shell; and
    a heat sink disposed in a rear side of the metal shell, wherein the metal shell includes a rear opening communicating with the receiving space, and the heat sink covers the rear opening;
    further includes a heat conducting member assembled with the heat sink, the heat conducting member extends forward beyond a front end of the connector; wherein
    the metal shell includes an intermediate member dividing the receiving space into an upper receiving space and a lower receiving space spaced apart from the upper receiving space in a vertical direction; wherein
    the intermediate member includes a lower through hole communicating with the lower receiving space, the metal shell includes a heat dissipation block received in the intermediate member to extend through the lower through hole into the lower receiving space for thermal conduction with a plug module received in the lower receiving space, and the heat conducting member is thermally conducted with the heat dissipation block; wherein
    the top wall includes an upper through hole connecting with the upper receiving space, the metal shell includes an upper heat sink disposed on the top wall, the upper heat sink extends through the upper through hole into the upper receiving space and is thermally conducted with a plug module received in the upper receiving space.

2. The electrical connector assembly as claimed in claim 1, wherein the heat conducting member directly connects with the heat dissipation block.

3. The electrical connector assembly as claimed in claim 1, wherein the heat conducting member includes a pair and the pair of heat conducting members are disposed on the both sides of the heat dissipation block.

4. The electrical connector assembly as claimed in claim 1, wherein the heat sink includes a plurality of heat dissipation channels extending in a front-to-back direction perpendicular to the vertical direction, and the upper heat sink includes a plurality of heat dissipation channels extending in the front-to-back direction.

5. The electrical connector assembly as claimed in claim 1, wherein the metal shell includes a buckle member transversely spanning the upper heat sink and fitting with the side wall to fix the upper heat sink to the metal shell.

6. The electrical connector assembly as claimed in claim 1, wherein the heat sink includes a mounting hole, and the heat conducting member is mounted in the mounting hole.

7. An electrical connector assembly comprising:
    a metal shell including a top wall, a bottom wall, a pair of parallel spaced side walls connecting the top and bottom walls, a receiving space formed by the top wall, the bottom wall and the side walls with a front opening forwardly communicating the receiving space with an exterior, the top wall forming a top opening and the bottom wall forming a bottom opening, said shell forming no rear wall but a rear opening rearwardly communicating with the exterior;
    an upper heat sink intimately positioned upon the top wall and covering the top opening in a vertical direction
    a connector received in a rear portion of the receiving space of the metal shell and covering the bottom opening in the vertical direction; and
    a rear heat sink disposed intimately behind the shell and covering the rear opening to forwardly communicate with the receiving space in a front-to-back direction perpendicular to the vertical direction; wherein the rear heat sink is supported by a pair of heat conductive members which extend through the connector along the front-to-back direction; wherein the metal shell includes an intermediate member dividing the receiving space into an upper receiving space and a lower receiving space spaced apart from the upper receiving space in said vertical direction; wherein the intermediate member includes a lower through hole communicating with the lower receiving space, the metal shell includes a heat dissipation block received in the intermediate member to extend through the lower through hole into the lower receiving space for thermal conduction with a plug module received in the lower receiving space, and the heat conducting member is thermally conducted with the heat dissipation block; wherein said upper heat sink extends through the top opening into the upper receiving space and is thermally conducted with a plug module received in the upper receiving space.

8. The electrical connector assembly as claimed in claim 7, wherein rear heat sink includes a plurality of fins unified by at least one transverse bar through which the pair of heat conductive members extend along the front-to-back direction.

9. The electrical connector assembly as claimed in claim 8, wherein the fins form corresponding heat dissipation channels along the front-to-back direction, the heat dissipation channel at a center is deepest while those at two sides are shallowest for complying with extension of the pair of corresponding heat conductive members.

10. The electrical connector assembly as claimed in claim 8, wherein a rear edge of each of said side walls forwardly abuts against the transverse bar.

11. The electrical connector assembly as claimed in claim 10, wherein the rear edge of each of said side walls forms a protrusion forwardly abutting the transverse bar.

* * * * *